(12) United States Patent
Verie et al.

(10) Patent No.: US 6,274,882 B1
(45) Date of Patent: Aug. 14, 2001

(54) INDIUM-BASED ALLOY AND AN INFRARED TRANSDUCER USING SUCH AN ALLOY

(75) Inventors: Christian Verie, Antibes; Dominique Lorans, Poitiers; Michel Poirier, Pontoise, all of (FR)

(73) Assignee: Sagem SA, Paris (FR)

( * ) Notice: Subject to any disclaimer, the term of this patent is extended or adjusted under 35 U.S.C. 154(b) by 0 days.

(21) Appl. No.: 09/258,203

(22) Filed: Feb. 26, 1999

(30) Foreign Application Priority Data

Feb. 26, 1998 (FR) .................................................. 98 02344

(51) Int. Cl.$^7$ ...................... H01L 29/06; H01L 31/0336; H01L 31/072
(52) U.S. Cl. ............................. 257/22; 257/184; 257/188; 257/189; 257/614
(58) Field of Search ................. 257/21, 22, 103, 257/184, 188, 189, 190, 614

(56) References Cited

U.S. PATENT DOCUMENTS 5,462,008   10/1995   Razeghi .

5,577,061   11/1996   Hasenberg et al. .

FOREIGN PATENT DOCUMENTS 9605621        2/1996  (WO) .
WO 96/05621    2/1996  (WO) .

OTHER PUBLICATIONS

Asahii et al.; "New semiconductors TlInGaP and their gas source MBE growth"; Proceedings of the Ninth International Conference on Molecular Beam Epitaxy, Malibu, CA, USA, Aug. 5–9, 1996, vol. 175–1762, pp. 1195–1199.
XP002081274—ISSN 0022–0248, Journal of Crystal Growth, May 1997, Elsevier, Netherlands—Whole document.
Patent Abstracts of Japan—vol. 007, No. 049 (E6161), Feb. 25, 1983 & JP 197877 A (Nippon Denki KK), Dec. 4, 1982 Abstract.

*Primary Examiner*—Minh Loan Tran
(74) *Attorney, Agent, or Firm*—Larson & Taylor, PLC

(57) ABSTRACT

The alloy is for making an infrared transducer. It is constituted by $(In_{1-x}Tl_x)(As_{1-y}Sb_y)$ in which $0 \leq x < 1$ and $0 < y < 1$ (where x and y are less than ½). On a GaSb or AlSb substrate, the transducer comprises an active layer of the alloy having a composition such that its lattice is of a size that is equal to that of the substrate material.

8 Claims, 3 Drawing Sheets

INDIUM-BASED ALLOY AND AN INFRARED TRANSDUCER USING SUCH AN ALLOY

BACKGROUND OF THE INVENTION

The present invention relates to alloys comprising, in addition to at least one heavy element from column III of Mendeleev's periodic table and specifically indium or thallium, at least two elements from group V usable on a monocrystalline substrate, and a generally binary compound of elements from groups III and V to constitute an infrared emission transducer such as a light-emitting diode, or an infrared detector such as a photodiode.

Numerous composite semiconductors have already been proposed for infrared detection. A widely-used material is (Cd, Hg)Te deposited by epitaxial crystal growth on a monocrystalline substrate of (Cd Te) or of (Cd, Zn)Te. These combinations of elements from groups II and VI of the periodic classification suffer from various drawbacks. Their forbidden bands vary very quickly with alloy composition so that it is difficult to make matrices having a large number of pixels that all have the same cutoff wavelength; the crystal lattice has numerous defects, in particular in thermal infrared detectors, thereby generating noise.

Proposals have also been made for various components that associate elements from groups III and V, and in particular:

$(In_{1-x}Tl_x)$ P on an Inp substrate;

$(In_{1-x}Tl_x)$ As on an InAs substrate;

$(In_{1-x}Tl_x)$ Sb on an InSb substrate; and $(In_{1-x}Tl_x)$ $(As_{1-y}P_y)$ on an InP substrate.

It is also known that most transducers are designed to operate in the 3 micron ($\mu$m) to 5 $\mu$m range (mid infrared) or in the 8 $\mu$m to 12 $\mu$m range (thermal infrared). The above compounds, described in document WO 96/05621 to which reference can be made, do not make it possible simultaneously and to a sufficient extent, to fulfill both of the conditions that are necessary for making transducers with a large number of pixels, i.e. the ability to adapt cutoff wavelengths merely by changing the proportions of the components, and having very few lattice defects when they are made by epitaxial growth on an appropriate substrate.

SUMMARY OF THE INVENTION

An object of the invention is to provide an epitaxially grown semiconductor material making it possible to build a transducer operating in wavelengths that are adjustable, in particular in the 3 $\mu$m–5 $\mu$m band or in the 8 $\mu$m–12 $\mu$m band, having a zinc blende type crystal structure with a lattice constant that corresponds to that of a GaSb or an AlSb microcrsytalline substrate on which the component can be produced by methods that are now well mastered.

To this end, according to an aspect of the invention, there is provided a compound for an infrared transducer constituted by a quaternary alloy $(In_{1-x}Tl_x)$ $(As_{1-y}Sb_y)$ in which $0 \leq x < 1$ and $0 < y < 1$.

A transducer is then constituted by a layer of such material grown epitaxially on a substrate which is generally GaSb or AlSb.

Small concentrations of Sb and Tl suffice to obtain forbidden bands $E_0$ corresponding to the 3 $\mu$m to 5 $\mu$m and the 8 $\mu$m to 12 $\mu$m bands. Because these concentrations are small, the zinc blende crystal structure of In(As,Sb) is conserved so no difficulty is encountered during epitaxial growth when implementing methods close to the well known methods that are used for making epitaxially-grown layers of InAs, InSb and $InAs_{1-y}Sb_y$ ternary alloys. These small concentrations of Tl and Sb lead to a crystal lattice constant having a value that corresponds to that for GaSb or AlSb monocrystals as used for making the substrate for epitaxial growth. Detectors for use in the 8 $\mu$m–12 $\mu$m band must operate at a temperature that is low, generally about 80 K. At this temperature, the cutoff wavelength for the 8 $\mu$m–12 $\mu$m band corresponds substantially to $E_0$=0.1 eV; cutoff for the 3 $\mu$m–5 $\mu$m band corresponds substantially to 0.25 eV. The above-defined quaternary alloy which can in some cases be reduced to an $InAs_{1-y}Sb_y$ ternary alloy makes it possible to obtain a lattice constant corresponding to that of such a monocrystalline substrate of GaSb or AlSb.

Given that it is not known at present how to make TlAs monocrystals, the lattice size of the compound can be calculated only approximately by various approaches. All of them make it possible to determine with sufficient accuracy the precise compositions to be used for the quaternary component. In practice, for a detector that is to operate at 80 K, satisfactory results are obtained with components in which the InAs content is largely in the majority. To obtain a lattice size matching with the GaSb or AlSb substrate in the 3 pm to 5 $\mu$m band ($E_0$=0.25 eV) and in the 8 $\mu$m to 12 $\mu$m band ($E_0$=0.10 eV), the following results have been obtained:

| GaSb substrate | | | | |
|---|---|---|---|---|
| band: | 3 $\mu$m–5 $\mu$m: | y = 7% to 8% | x = 4% to 5% | (1) |
| | 8 $\mu$m–12 $\mu$m: | y = 3% to 6% | x = 12% to 15% | |
| AlSb substrate | | | | |
| | 3 $\mu$m–5 $\mu$m: | y = 18% to 19% | x = 0% | |
| | 8 $\mu$m–12 $\mu$m: | y = 14% to 16% | x = 8% to 10% | |

In practice, infrared transducers are made that comprise a binary substrate supporting an epitaxial $(In_{1-x}Tl_x)$ $(As_{1-y}Sb_y)$ layer in which the values of x and y are much less than 1, and generally less than 0.2.

On top, the transducer may have an n+ doped accumulation layer, while the main layer is of p type; the disposition could be reversed.

The above characteristics and others will appear more clearly on reading the following description of particular embodiments given as non-limiting examples. The description refers to the accompanying drawings:

DETAILED DESCRIPTION

A compound that is at least ternary, having indium and arsenic as its major components, and usable as an infrared receiver or transmitter transducer, is selected as a function of the wavelength range in which the transducer is to operate, and as a function of the substrate selected, which is generally GaSb or AlSb.

Figure 1:
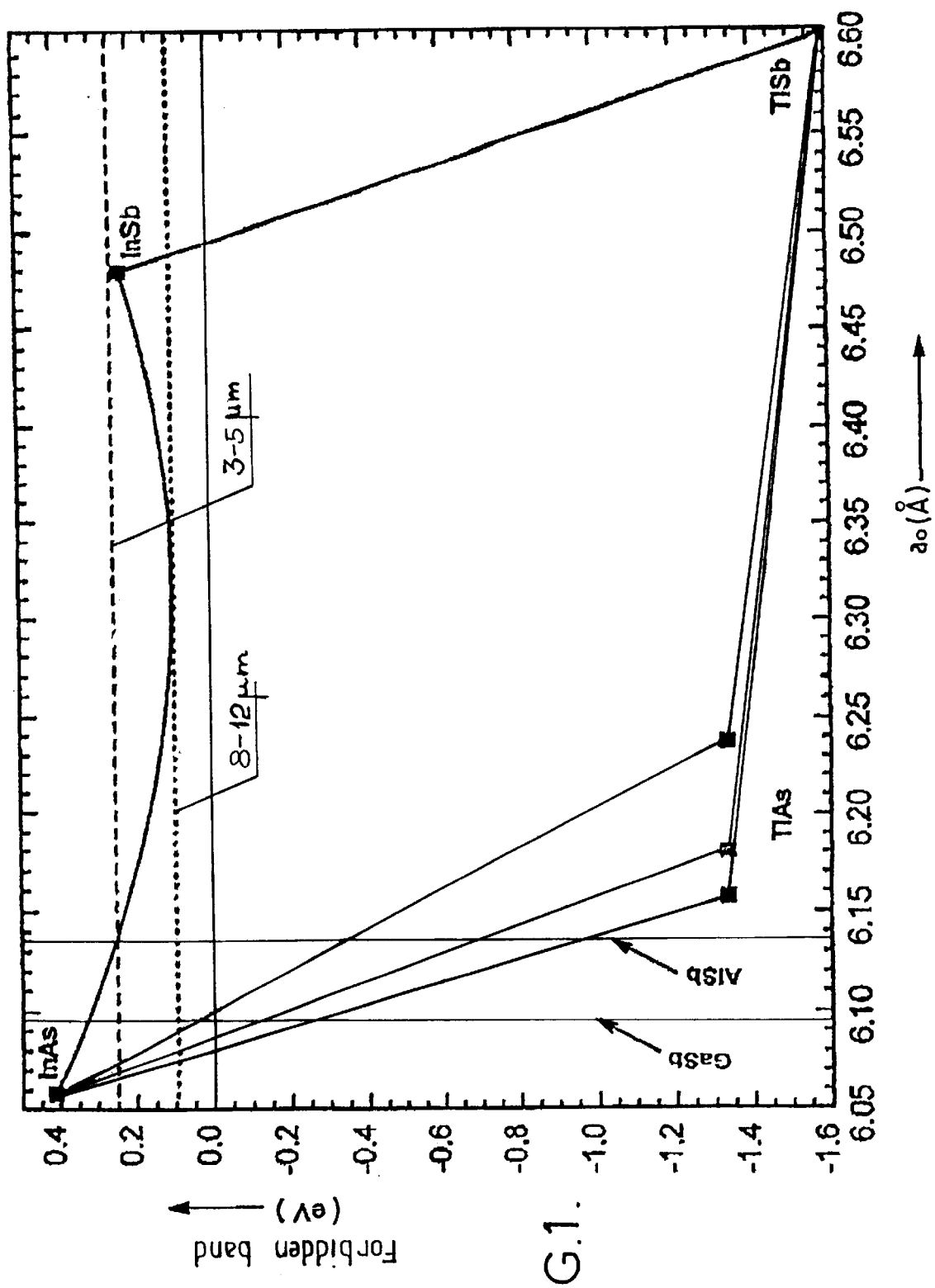
FIG. 1 is a diagram showing how the forbidden band $E_0$ varies as a function of crystal lattice constant, in the composition domain of (InTl) (AsSb) quaternary alloys.

The diagram of FIG. 1 shows the forbidden band and the size of the crystal lattice constant $a_0$ for InAs, InSb, TlSb, and TlAs. The crystal lattice parameters for InAs and InSb compounds are known with great accuracy. The parameters of TlSb which has not been synthesized in the zinc blende structure, have been calculated by various approaches, all of which have been given a value very close to 6.6 Å. FIG. 1 shows a possible range of values for the TlAs lattice constant which has never yet been synthesized in the zinc blende structure and for which calculation produces values lying in the range 6.15 Å to 6.24 Å. By way of illustration, FIG. 1 gives three examples of such calculated results performed in this range, specifically at 6.15 Å, 6.18 Å, and 6.238 Å. For In(As, Sb) ternary alloys, variation in the forbidden band and in the crystal lattice constant as a function of composition is well known. The limits of the range for the quaternary alloy derived from TlAs and TlSb have been assumed to be straight lines interconnecting points representative of other binary compounds, which gives sufficient accuracy given since the contents of Tl and of Sb are low.

FIG. 1 also shows the sizes of the lattice for GaSb and AlSb which are respectively 6.096 Å and 6.136 Å. To reduce defect density, particularly density of dislocations caused by inter-planar mismatches between an pitaxially-grown layer and the substrate, the at least ternary compound that is to be used must have a lattice constant that corresponds to that of the substrate, i.e. it must lie on one of the vertical lines in FIG. 1 which correspond to GaSb and to AlSb.

In addition, the forbidden band must correspond to the design wavelength range of the transducer at its operating temperature. For a temperature of 80 K, FIG. 1 shows the values of the forbidden band: E=0.25 eV for the 3 $\mu$m–5 $\mu$m band, and E=0.1 eV for the 8 $\mu$m–12 $\mu$m band.

In the diagram, it can be seen that it is always possible both to match the lattice constant or size with that of the substrate and to provide a forbidden band that is suitable for the 3 $\mu$m–5 $\mu$m band and for the 8 $\mu$m–12 $\mu$m band, and to do so for compositions that are very close to InAs.

A transducer operating solely in the 3 $\mu$m–5 $\mu$m band can be kept at a temperature that is higher than 80 K, in which case the forbidden band is shifted, but it remains possible to find a quaternary composition that satisfies both criteria at the same time, and which satisfies in particular the forbidden band value (which determines the cutoff wavelength of a detector, and the emission maximum of an emitter).

By way of example, assuming that the lattice constant of TlAs is 6.157 Å, which appears to be most likely, the following values are obtained which lie well within the ranges given in equation (1).

| GaSb substrate | | | |
|---|---|---|---|
| band: | 3 $\mu$m–5 $\mu$m: | y = 7.7% | x = 5% |
| | 8 $\mu$m–12 $\mu$m: | y = 5.4% | x = 14.7% |
| AlSb substrate | | | |
| | 3 $\mu$m–5 $\mu$m: | y = 18.3% | x = 0 |
| | 8 $\mu$m–12 $\mu$m: | y = 16% | x = 8.3% |

It should be observed that assuming a TlAs lattice constant $a_0$ of 6.238 Å instead of 6.157 Å would hardly change the optimum composition. This composition would become:

| GaSb substrate | | | |
|---|---|---|---|
| band: | 3 $\mu$m–5 $\mu$m: | y = 7.0% | x = 4.6% |
| | 8 $\mu$m–12 $\mu$m: | y = 3.5% | x = 12.9% |

| -continued | | | |
|---|---|---|---|
| AlSb substrate | | | |
| | 3 $\mu$m–5 $\mu$m: | y = 18.3% | x = 0 |
| | 8 $\mu$m–12 $\mu$m: | y = 14.3% | x = 9.5% |

Various possible structures for transducers of the invention are given below by way of example. In all of them, the quaternary compound layer can be made by epitaxial growth, e.g. in vapor by pyrolyzing organic metallic compounds, or under an ultra vacuum by chemical or atomic molecular beams. Those techniques are now well mastered. As explained below, it is equally possible to make structures suitable for being illuminated by the front face as it is to make detector structures suitable for illumination via the rear face, including hybridizing by connection with beads of indium.

Figure 2:
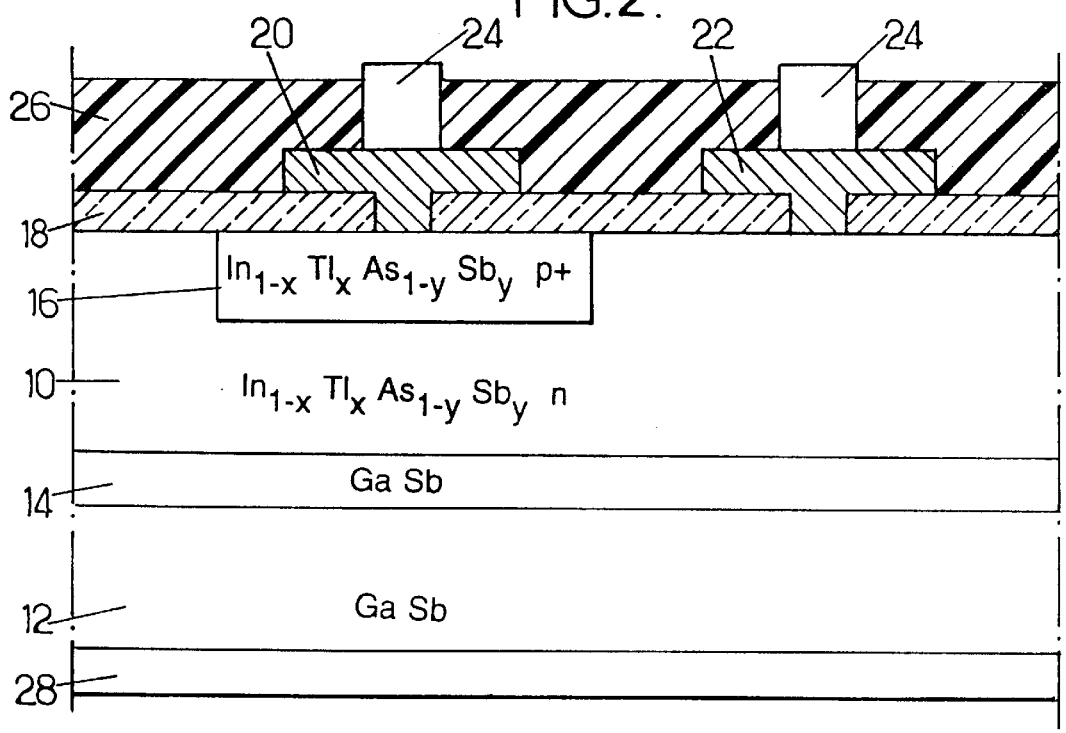
FIGS. 2, 3, and 4 show three infrared transducer structures in accordance with the invention.

The structure shown in FIG. 2 comprises an n-doped $(In_{1-x}Tl_x)(As_{1-y}Sb_y)$ quaternary alloy layer on a non-doped photocrystalline GaSb substrate 12.

In a first step, a thin GaAs layer 14 is deposited on the substrate 12 whose thickness is generally of the order of 500 $\mu$m when it is desired to make a matrix having 256×256 photosensitive sites. This layer of thickness lying generally in the range 10 nm to 100 nm is designed to act as a buffer which removes surface defects from the substrate. It can be made by homo-epitaxial growth.

The n-doped $(In_1Tl_x)(As_{1-y}Sb_y)$ active layer is then made, e.g. by epitaxial growth. Molecular beam epitaxy or vapor epitaxy on the basis of organo-metallic compounds can be used. The composition of the layer is adjustable by known means, e.g. by acting on the evaporation rates of the starting compounds used. In general, a layer 10 will be made that is about 10 $\mu$m thick.

In order to manufacture an array of semiconductor junction detectors, p+ doped islands are established for each of the photosensitive sites that is to be made. These islands 16 are constituted, for example, either by implanting Be or Mg ions, or by diffusing impurities, or by local epitaxial growth. Implanting Be or Mg degrades the crystal lattice little.

A passivation layer 18 is then deposited on the surface. This layer can be constituted by native oxide or by a thin deposit of zinc sulfide whose blende structure enables it to adhere well to the active layer 10. For reasons of transparency, it is also possible to make use of ZnS, in particular for detectors operating in the 8 $\mu$m–12 $\mu$m band, and silicon oxide $SiO_2$ for detectors operating in the 3 $\mu$m–5 $\mu$m band.

The necessary ohmic contacts can then be made by conventional photolithographic processes and depositing metal. For each photosensitive site, a p contact 20 is made connected to an island 16 and an n contact 22 is made connected to the n-type active layer.

For the metal constituting the contacts, it is possible to use Al, Au, Ni, Pt, or Ti-W, in particular.

It is also possible to make the p+ doped islands 16 after depositing a passivation layer and after photo-lithography, prior to putting the contacts 20 and 22 in place.

When the detector is to be bonded on a substrate and illuminated via its rear face, it is provided with indium beads 24 enabling it to be fixed on the read integrated circuit on a silicon substrate. For this purpose, a layer 26 of insulation is made that can be constituted in particular by ZnS or $SiO_2$. Passages are formed through said layer by photolithography and they receive the indium microbeads.

After the structure has been hybridized by fixing the indium beads on the read circuit, the substrate 12 can be thinned to increase its transparency, and the rear face is generally covered in a passivation layer and in an antireflection layer.

Figure 3:
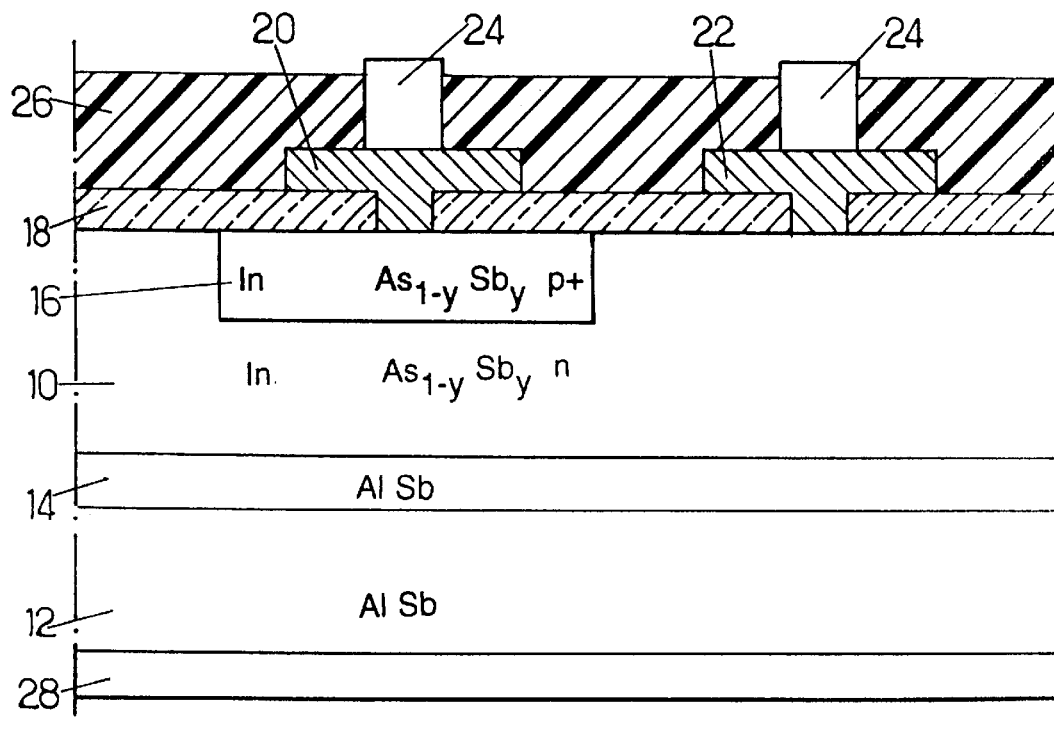

FIG. 3 shows a modified embodiment having the same structure but with an active layer of In $(As_{1-y}Sb_y)$ ternary compound on an AlSb substrate, to constitute a detector that operates in the 3 µm–5 µm band.

It is made in the same manner as in the preceding example and the same reference numerals designate elements that correspond in FIGS. 2 and 3.

Figure 4:
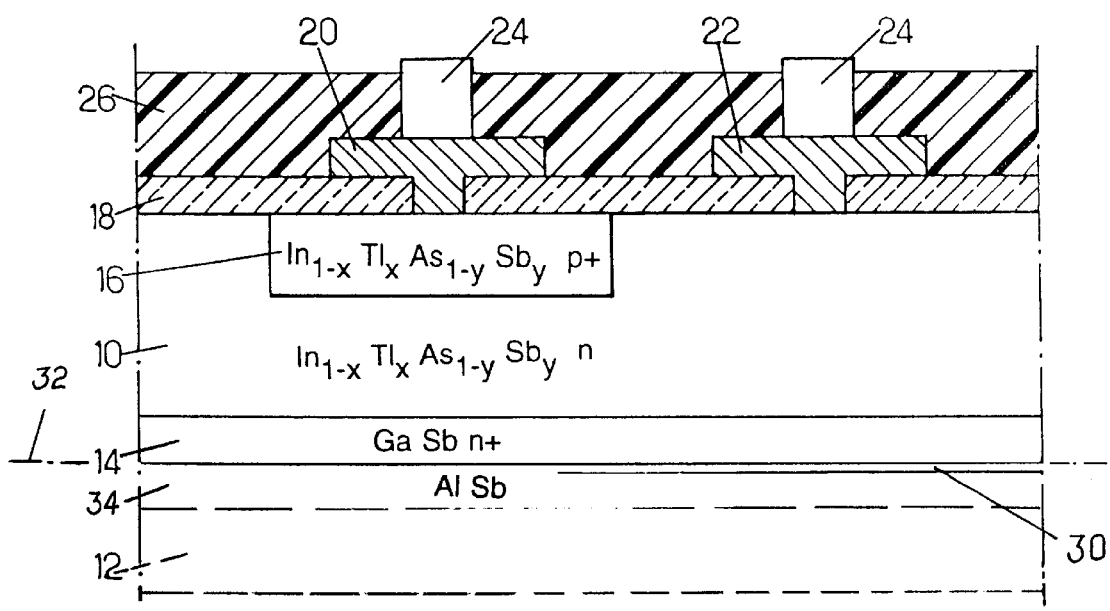

FIG. 4, in which elements corresponding to those of FIG. 2 are again designated by the same reference numerals, differs from the preceding figure particularly in that during manufacture, an intermediate layer 34 of AlSb is deposited having a lattice size that is very close to that of the GaSb substrate. This layer 34 can be dissolved selectively after the structure has been hybridized, thereby enabling the detector to be detached from the non-doped substrate 12. After separation along line 32, a very thin layer 30 of n+ doped GaSb is deposited to guarantee good surface state, and a final antireflection passivation layer is added similar to the layer 28. Such a structure makes it possible to avoid the mechanical and chemical step of thinning the substrate as is required in the example of FIG. 2.

It is also possible to make detectors that are illuminated via the front face, and photoemitters that emit via the front face by using layers of insulating and passivating material that are transparent at the selected wavelength, e.g. ZnS for the 8 µm–12 µm band, and $SiO_2$ for the 3 µm–5 µm band.

Numerous modified embodiments are also possible.

When the transducer is to operate with illumination or emission via its front face, without hybridization, a window of appropriate material can be added to the front face. This window will generally be made of n+ doped GaSb.

The doping elements shown in FIGS. 2 to 4 can be reversed and it is possible to use Cd and Zn as doping impurities.

Furthermore, it is possible to make a detection matrix that operates both in the 3 µm–5 µm band and in the 8 µm–12 µm band by establishing on a common GaSb or AlSb substrate, sites that are interleaved in a checkerboard configuration and that correspond to operation in different wavelength ranges. It is also possible to make transducers of the kind shown in FIGS. 2 and 4 that are designed for the 8 µm–12 µm band, and to superpose thereon photosensitive sites designed for the 3 µm–5 µm band that are placed on the front face. Under such circumstances, the selected operating temperature must be low enough to enable satisfactory operation in the 8 µm–12 µm band.

What is claimed is:

1. An alloy for constituting an active layer of an infrared transducer consisting of $(In_{1-x}Tl_x)$ $(As_{1-y}Sb_y)$ alloy, where 0<x<1 and 0<y<1 and x and y are so selected that a lattice constant of the alloy matches that of a compound selected from the group consisting of GaSb and AlSb.

2. An infrared transducer for use for detecting infrared in a 3–5 µm infrared band comprising, on a GaSb or an AlSb substrate, an active layer of $(In_{1-x}Tl_x)$ $(As_{1-y}Sb_y)$ compound where $0 \leq x<1$ and 0<y<1, of a composition such that a lattice constant of the compound of the active layer matches that of the substrate material, the values of x and y being:

for a GaSb substrate: y=7% to 8% x=4% to 5% and
for a AlSb substrate: y=18% to 19% x=0%.

3. A transducer according to claim 2, wherein the alloy of the active layer is n-doped, and the transducer includes, on a front portion thereof, p+ doped islands each constituting an active site.

4. An infrared transducer comprising, on a substrate of GaSb or AlSb compound, an active layer of $(In_{1-x}Tl_x)$ $(As_{1-y}Sb_y)$ alloy where 0<x<1 and 0<y<1 and x and y are such that a lattice constant of the alloy matches that of the substrate compound.

5. An infrared transducer according to claim 4 for use in the 8 µm–12 µm infrared band, wherein the values of x and y are:

for a GaSb substrate: y=3% to 6% x=12% to 15% and
for a AlSb substrate: y=14 to 15% x=8% to 10%.

6. A transducer according to claim 4, wherein the alloy of the active layer is n-doped, and the transducer includes, on a front portion thereof, $p^+$ doped islands each constituting an active site.

7. A transducer according to claim 6, wherein the sites are interleaved in a checkerboard configuration corresponding to different wavelength ranges.

8. A transducer according to claim 7, wherein sites for the 3 µm–5 µm range are superposed on a matrix for the 8 µm to 12 µm range.

* * * * *